(12) United States Patent
Murry et al.

(10) Patent No.: US 6,765,948 B2
(45) Date of Patent: Jul. 20, 2004

(54) VCSEL ASSEMBLY WITH EDGE-RECEIVING OPTICAL DEVICES

(75) Inventors: Stefan J. Murry, Houston, TX (US); James N. Baillargeon, Sugar Land, TX (US)

(73) Assignee: Applied Optoelectronics, Inc., Sugar Land, TX (US)

(*) Notice: Subject to any disclaimer, the term of this patent is extended or adjusted under 35 U.S.C. 154(b) by 0 days.

(21) Appl. No.: 09/855,853

(22) Filed: May 15, 2001

(65) Prior Publication Data

US 2002/0090013 A1 Jul. 11, 2002

Related U.S. Application Data

(63) Continuation-in-part of application No. 09/757,061, filed on Jan. 9, 2001.

(51) Int. Cl.[7] .............. H01S 5/00; H01S 3/20; H01S 3/14; H01S 3/082; H01S 3/08
(52) U.S. Cl. .............. 372/107; 372/43; 372/50; 372/54; 372/68; 372/97; 372/101; 372/108
(58) Field of Search .............. 372/107, 50, 43, 372/101, 108, 97, 54, 68, 36; 385/50, 90, 49

(56) References Cited

U.S. PATENT DOCUMENTS

| | | | |
|---|---|---|---|
| 5,163,113 A | * 11/1992 | Melman | 385/31 |
| 5,468,656 A | 11/1995 | Shieh et al. | |
| 5,548,607 A | 8/1996 | Tsang | |
| 5,625,189 A | * 4/1997 | McCaul et al. | 250/343 |
| 5,625,636 A | 4/1997 | Bryan et al. | |
| 5,805,755 A | 9/1998 | Amersfort et al. | |
| 5,867,521 A | 2/1999 | Macomber | |
| 5,896,481 A | * 4/1999 | Beranek et al. | 385/90 |
| 5,901,168 A | 5/1999 | Baillargeon et al. | |
| 5,985,686 A | 11/1999 | Jayaraman | |
| 5,986,790 A | * 11/1999 | Ota et al. | 398/1 |
| 6,112,002 A | * 8/2000 | Tabuchi | 385/50 |
| 6,162,655 A | 12/2000 | Johnson et al. | |
| 2002/0034205 A1 | * 3/2002 | Evans et al. | 372/50 |
| 2002/0037137 A1 | * 3/2002 | Wu et al. | 385/49 |

OTHER PUBLICATIONS

MacDougal et al., "Electrically–Pumped Vertical–Cavity Lasers with A10–GaAs Reflectors," *IEEE Photonics Tech. Letters*, vol. 8, No. 3, (1996) pp. 310–312.
Sandusky, J. and Brueck, S., "A CW External–Cavity Surface–Emitting Laser," *IEEE Photonics Tech. Letters*, vol. 8, No. 3, (1996), pp. 313–315.
Hauffe et al., "Methods of Passive Fiber Chip Coupling of Integrated Optical Devices," *Proc. 2000 Electronic Components and Technology Conference*, (2000), pp. 238–243.
Noll, R. J. and Macomber, S. H., "Analysis of Grating Surface Emitting Lasers," *IEEE J. Quantum Electronics*, vol. 26, No. 3, (1990), pp. 456–466.
*Optoelectronic Packaging*, eds. Mickelson et al., (New York: John Wiley & Sons, 1997), esp. ch. 9, "Array Device Packaging," by Nagesh R. Basavanhally & Ronald A. Nordin, esp. pp. 143–148.
Okamoto, Katsunari, "Hybrid Integration Technology Using PLC Platforms," *Fundamentals of Optical Waveguides*, (2000), Section 9.7, pp. 390–400.

* cited by examiner

Primary Examiner—Paul Ip
Assistant Examiner—Armando Rodriguez
(74) Attorney, Agent, or Firm—N. Stephen Kinsella

(57) ABSTRACT

The present invention is directed to a method and system for conditioning the output signals of an array of surface-emitting lasers with an array of edge-receiving optical devices. Both the array of surface-emitting lasers and the array of edge-receiving optical devices are mounted on an optical bench substrate. The array of edge-receiving optical devices may also be monolithically fabricated on the optical bench substrate. The array of surface-emitting lasers and the array of edge-receiving optical devices are aligned by alignment features and slots, which are fabricated on the optical bench substrate so as to optically couple the array of surface-emitting lasers to the array of edge-receiving optical devices.

8 Claims, 5 Drawing Sheets

VCSEL ASSEMBLY WITH EDGE-RECEIVING OPTICAL DEVICES

CROSS REFERENCE TO RELATED PATENTS

This patent application is a continuation-in-part of U.S. patent application Ser. No. 09/757,061, filed on Jan. 9, 2001, entitled "Method And Apparatus For Coupling A Surface-Emitting Laser To An External Device," the entirety of which is hereby incorporated herein by reference for all purposes.

BACKGROUND OF THE INVENTION

1. Field of the Invention

This invention relates generally to devices that emit electromagnetic radiation and, in particular, to optically coupling one or more surface-emitting lasers to corresponding optical receiving devices such as amplifiers or modulators.

2. Description of the Related Art

The following descriptions and examples are not admitted to be prior art by virtue of their inclusion within this section.

Lasers have a wide range of industrial and scientific uses. There arc several types of lasers, including gas lasers, solid-state lasers, liquid (dye) lasers, and free electron lasers. Semiconductor lasers are also in use. The possibility of amplification of electromagnetic waves in a semiconductor superlattice structure, i.e., the possibility of semiconductor diode lasers, was predicted in a seminal paper by R. F. Kazarinov, et al., "Possibility of the Amplification of Electromagnetic Waves in a Semiconductor with a Superlattice," *Soviet Physics Semiconductors*, vol. 5, No. 4, pp. 707–709 (October 1971). Semiconductor laser technology has continued to develop since this discovery.

There are a variety of types of semiconductor lasers. Semiconductor lasers may be diode lasers (bipolar) or non-diode lasers such as quantum cascade (QC) lasers (unipolar). Semiconductor lasers of various types may be electrically pumped (by a DC or AC current), or pumped in other ways, such as by optically pumping (OP) or electron beam pumping. Semiconductor lasers are used for a variety of applications and can be built with different structures and semiconductor materials, such as gallium arsenide.

Additionally, semiconductor lasers may be edge-emitting lasers or surface-emitting lasers (SELs). Edge-emitting semiconductor lasers output their radiation parallel to the wafer surface, while in SELs, the radiation is output perpendicular to the wafer surface.

One type of SEL is the vertical cavity surface emitting laser (VCSEL). The VCSEL structure usually consists of an active (gain) region sandwiched between two distributed Bragg reflector (DBR) mirrors. The DBR mirrors of a typical VCSEL can be constructed from dielectric or semiconductor layers (or a combination of both, including metal mirror sections). Other types of VCSELs sandwich the active region between metal mirrors. The space between the reflective planes is often referred to as the resonator. VCSELs typically have a circular laser beam and a smaller divergence angle, and are therefore more attractive than edge-emitting lasers in some applications. Further background discussion of VCSELs and related matters are found in: U.S. Pat. No. 5,468,656 (1994), Shieh et al., "Method of making a VCSEL"; U.S. Pat. No. 5,985,686 (1999), Jayaraman, "Process for manufacturing vertical cavity surface emitting lasers using patterned wafer fusion and the device manufactured by the process"; MacDougal et al., "Electrically-Pumped Vertical-Cavity Lasers with AlO—GaAs Reflectors," *IEEE Photonics Letters*, vol. 8, No. 3, March 1996. A variant on the standard VCSEL is the vertical-external-cavity surface-emitting laser (VECSEL). VECSELs are described in J. Sandusky & S. Brueck, "A CW External-Cavity Surface-emitting Laser," *IEEE Photon. Techn. Lett.* 8, 313–315 (1996).

Semiconductor lasers are typically powered by applying an electrical potential difference across the active region, which causes a current to flow therein. Electrons in the active region attain high energy states as a result of the potential applied. When the electrons spontaneously drop in energy state, photons are produced. Some of those photons travel in a direction perpendicular to the reflective planes of the laser. As a result of the ensuing reflections, the photons can travel through the active region multiple times. When those photons interact with other high energy state electrons, stimulated emission can occur so that two photons with identical characteristics are present. If most electrons encountered by the photons are in the high energy state, the number of photons traveling between the reflective planes tends to increase. A typical laser includes a small difference in reflectivity between its mirrors, giving rise to amplification of light and thus lasing. The primary laser output is emitted through the reflective plane having lower reflectivity.

The use of semiconductor lasers (both edge-emitting and surface-emitting) for forming a source of optical energy is attractive for a number of reasons. For example, diode lasers have a relatively small volume and consume a small amount of power as compared to conventional laser devices. Further, the diode laser is a monolithic device, and does not require a combination of a resonant cavity with external mirrors and other structures to generate a coherent output laser beam.

VCSELs are used in a variety of applications. In telecommunications, for example, output laser light of a precise wavelength is modulated to encode and transmit information. The laser may be externally modulated, or directly modulated. For external modulation, an optical modulator receives and then modulates the output of the laser. The signal may also be amplified, e.g., by an SOA (semiconductor optical amplifier), Raman amplifier, or Erbium-doped fiber amplifier. The modulator and amplifier may be used in series (in either order), or independently.

A typical telecommunications system uses optical fiber to guide the radiation from the modulation (or emission) point to the detection point. In any event, it is desirable to couple the output of the laser into a signal-conditioning, signal-receiving optical devices, such as an SOA or modulator. In cases of an array of lasers, e.g. a VCSEL array, it is desirable to couple the output of each laser to a corresponding optical receiving device.

There is, therefore, a need for improved methods and systems for coupling the output of each laser, e.g. of a VCSEL array, to an optical receiving device.

SUMMARY OF THE INVENTION

The present invention is directed to a method and system for conditioning the output signals of an array of surface-emitting lasers with an array of corresponding edge-receiving optical devices. Both the array of surface-emitting lasers and the array of edge-receiving optical devices are mounted on an optical bench substrate, for alignment and coupling. The array of edge-receiving optical devices may also be monolithically fabricated on the optical bench substrate. The array of surface-emitting lasers and the array of edge-receiving optical devices are aligned by alignment features, which are fabricated on the optical bench substrate so as to align and optically couple the array of surface-emitting lasers to the array of edge-receiving optical devices.

An advantage of the invention is the ability to separately optimize the performance of the laser and modulator.

Another advantage of the invention is that it enables the output of a surface-emitting laser to be conveniently modulated.

Another advantage of the invention is that it permits coupling a high percentage of power from a surface emitting laser to an external modulator or other device.

Another advantage of the present invention is allowing data modulation rates higher than direct modulation limits.

Another advantage is aligning arrays of surface emitting lasers with arrays of modulators and, in particular, aligning an array of surface-emitting lasers with a corresponding array of edge-receiving optical devices.

Still another advantage is decreasing the cost of manufacturing lasers with high modulation rate capacity.

Another advantage is that it allows coupling to an SOA which amplifies the output of the modulator.

Other and further features and advantages will be apparent from the following description of presently preferred embodiments of the invention, given for the purpose of disclosure and taken in conjunction with the accompanying drawings. Not all embodiments of the invention will include all the specified advantages. For example, one embodiment may only modulate the output of a surface-emitting laser, while another only aligns an array of surface emitting lasers with an array of modulators, or other edge-receiving optical devices.

BRIEF DESCRIPTION OF THE DRAWINGS

Other features and advantages of the invention will become apparent upon study of the following description, taken in conjunction with the attached FIGS. 1–5.

DETAILED DESCRIPTION OF THE INVENTION

Figure 1:
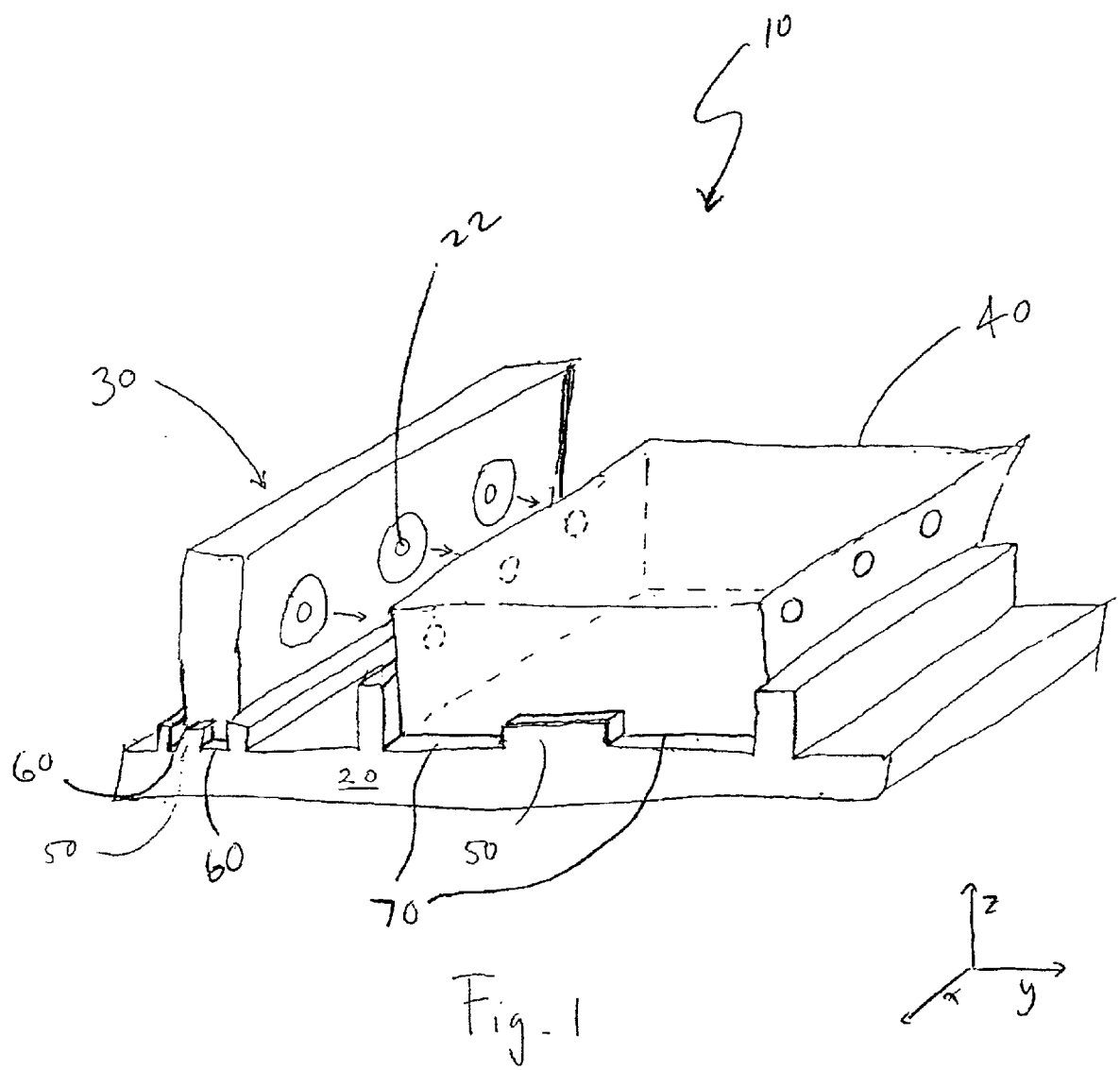
FIG. 1 is an isometric view of a system for conditioning a one-dimensional array of vertical cavity surface-emitting lasers (VCSELs) in accordance with an embodiment of the present invention.

Referring now to the drawings, the details of preferred embodiments of the invention are schematically illustrated.

As noted above, it can be desirable to couple the output of one or more (e.g. an array) of SELs (e.g. VCSELs) to one or more corresponding optical receiving devices, such as SOAs or optical modulators. Edge-emitting lasers emit the laser output beam from their edge; and typically employ corresponding edge-receiving optical devices. These are often fabricated together on the same substrate, monolithically. In this case, the laser and receiving device are automatically aligned and coupled, although it may be difficult to optimize the design of both since they are fabricated together.

In the present invention, an edge-receiving optical device is used to receive and condition the output of a surface-emitting laser (SEL). Typically, semiconductor epi-layers are grown on a plane perpendicular to the Miller index <100> vector. In this manner, the surface of the wafer and substrate is parallel to the epi-layers being grown, and perpendicular to the direction of growth. That is, surface-emitting devices emit light substantially parallel to the <100> vector, while edge-emitting devices emit light roughly perpendicular to the <100> vector, such as along the <110> vector or the <1$\bar{1}$0> vector. As the term is used this application, a surface-emitting lasers is one which emits an output laser beam substantially perpendicular to the surface of the epilayers and substrate of the laser (i.e., the output laser beam is parallel to the <100> vector. An edge-receiving optical device is one which is designed to receive an optical input at an edge, where the edge is perpendicular to the surface of the epilayers and substrate of the optical device.

The present invention, however, is not limited to the above-described embodiment. In fact, in other embodiments, surface-emitting devices may emit light parallel to the <110> vector or the vector. In another embodiment, an array of edge-receiving optical devices is used to receive and condition the output signals (laser output beams) of an array of SELs. Referring now to FIG. 1, there is shown an isometric view of a laser system 10 for conditioning the output signals of a one-dimensional array of vertical-cavity surface-emitting lasers (VCSEL) in accordance with an embodiment of the present invention. The system 10 includes an optical bench substrate 20. The system 10 further includes an array 30 of VCSELs, which is mounted on the optical bench substrate 20, and an array 40 of edge-receiving optical devices, which is also positioned on the optical bench substrate 20. The VCSELs of array 30 have the primary epi surface in the x-z coordinate plane and thus emit parallel to the y axis. The corresponding edge-receiving optical devices of array 40 receive light from VCSELs of array 30 in the edge in the x-z coordinate plane, which edge is perpendicular to the epi surface of the array 40, which is parallel to the x-y coordinate plane.

As will be appreciated, various mounting techniques may be employed to mount the array 30 of VCSELs and the array 40 of the edge-receiving optical devices on the optical bench substrate 20. For example, they may be mounted by solder or epoxy (not shown).

In accordance with an embodiment of the present invention, the optical bench substrate 20 is a silicon optical bench (SiOB), having suitable alignment features. SiOB technology employs an optical support bench having photolithographically formed or etched alignment features, such as mechanical alignment stops, notches, grooves, slots, pedestals, standoffs, and the like. These and other SiOB alignment techniques are described in Hauffe, et al. "Methods of Passive Fiber Chip Coupling of Integrated Optical Devices," *Proc. 2000 Electronic Components and Technology Conference* (May 2000), pp. 238–243, and in *Optoelectronic Packaging*, eds. Mickelson et al. (New York: John Wiley & Sons, 1997), esp. ch. 9, "Array Device Packaging," by Nagesh R Basavanhally & Ronald A. Nordin ("Basavanhally & Nordin"), esp. pp. 143–148 of Basavanhally & Nordin. Chapter 9 (Basavanhally & Nordin) of the Optoelectronics Packaging text is incorporated herein by reference. By employing such alignment techniques, various optoelectronic devices may be easily aligned with and thus coupled to corresponding optical devices mounted in precisely aligned positions on a support bench.

In an embodiment, to precisely align the VCSELs of array 30 with corresponding optical devices, for effective optical coupling, array 30 is mounted on substrate 50, which forms a silicon (or other material) optical bench, using various alignment features, such as stops 50 and grooves 60 and 70 (which grooves are defined by bounding walls, which may also be viewed as stops).

Figure 2:
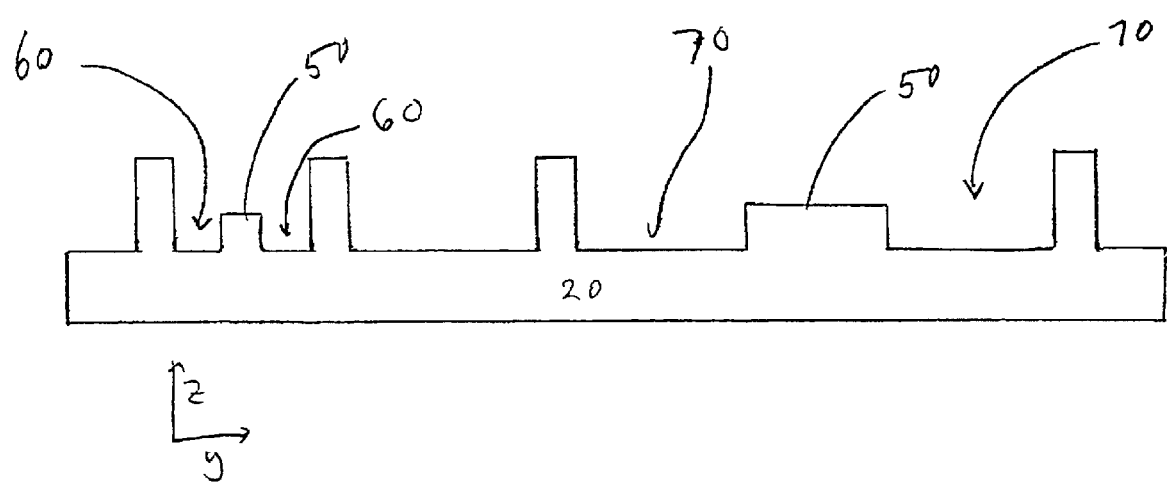
FIG. 2 is a cross-sectional view of the optical bench substrate in accordance with an embodiment of the present invention.

A cross-sectional view of the optical bench substrate in accordance with an embodiment of the present invention is shown in FIG. 2. In an alternative embodiment, the optical bench substrate 20 includes a slot 60 for receiving the array 30 of VCSELs. The slot 60 serves to fix array 30 from movement in the y direction and to hold the array 30 of VCSELs so that each VCSEL output signal is received and conditioned by a corresponding edge-receiving optical device. The optical bench substrate 20 further includes stops 50 on both sides of the optical bench substrate. The stops 50 serve as mechanical stops or guides that hold the array 30 of VCSELs in the slot 60 and to secure from movement in the x direction. Similarly, stops 50 hold the array 40 in the slot 70 and to secure from movement in the x direction, while slot 70 serves to fix array 40 from movement in the y direction. The alignment features also serve to properly align the array 30 of VCSELs and the array 40 of edge-receiving optical devices together so that each VCSEL output signal directly couples to a corresponding edge-receiving optical device.

The alignment features, i.e. slots 60 and 70 and stops 50, may be photolithographically fabricated in the optical bench substrate. One technique used in fabrication is electron beam lithography. Alternatively, the slot 60 and the stops 50 may be fabricated using lithographic alignment of a mask with the substrate 20 that has had a desired pattern imposed on the substrate 20 by lithography. By aligning the substrate 20 in a preferred orientation prior to lithography, subsequent etching can take place preferentially along various crystal axes of the substrate, including the <111> axis or another axis that is oriented at a desired angle to the <100> axis. These and other alignment techniques are described in Hauffe, et al. "Methods of Passive Fiber Chip Coupling of Integrated Optical Devices," *Proc.* 2000 *Electronic Components and Technology Conference* (May 2000), pp. 238–243, and in *Optoelectronic Packaging*, eds. Mickelson et al. (New York: John Wiley & Sons, 1997), esp. ch. 9, "Array Device Packaging," by Nagesh R. Basavanhally & Ronald A. Nordin ("Basavanhally & Nordin"). Chapter 9 (Basavanhally & Nordin) of the *Optoelectronics Packaging* text is incorporated herein by reference.

Figure 3:
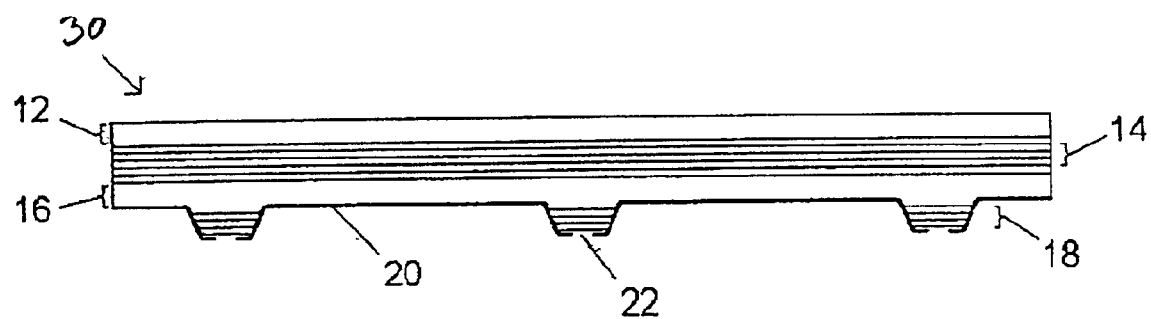
FIG. 3 is a cross-sectional view of a one-dimensional array of VCSELs in accordance with an embodiment of the present invention.

Referring now to FIG. 3, a one-dimensional array 30 of VCSELs is shown in cross-section, the cross-sectional view illustrating three VCSELs of VCSEL array 30 of FIG. 1. Array 30 is a one-dimensional (linear) array having a single row of N VCSELs. As will be appreciated, a VCSEL is a semiconductor laser that emits its output perpendicular to its p-n junction. Each VCSEL is built on a substrate 12 of semiconductor material. Various semiconductor materials known to those in the art can be employed.

Each VCSEL shares a first reflective plane 14. In one embodiment, the first reflective plane 14 comprises a DBR. A DBR consists of alternating layers of different semiconductors or different dielectrics. In one embodiment, forty alternating layers yield a reflectivity of 99.99%. In an alternative embodiment, the first reflective mirror or plane 14 can comprise a metal mirror rather than or in addition to a DBR.

Each VCSEL also shares the common active region 16 of VCSEL array 30. The active region 16 is a p-n junction and the width of the active region 16 controls the wavelength of emitted light. The widths of the first reflective plane 14, active region 16, and second reflective plane 18 are very small compared to the width of the substrate 12. (The widths shown for the various layers in FIG. 3 are not to scale.)

In the embodiment shown in FIG. 3, the second reflective plane 18 is separate for each VCSEL. In another embodiment, the VCSELs can share a common second reflective plane 18. Like the first reflective plane 14, the second reflective plane 18 can comprise a DBR or a metal mirror. The second reflective plane 18 is highly reflective, but preferably less reflective than the first reflective plane 14. In one embodiment, twenty-five alternating layers of a DBR yield a reflectivity of 99.9%.

A cladding 20 protects the VCSEL structure. Adjacent the second reflective plane 18, the cladding 20 defines a gap 22 that allows emission of radiation from the active region 16. The profile of the emitted radiation can be controlled by modifying the geometry of the emission area. For example, changes in the shape and size of the gap 22 affect the spatial profile of the emitted radiation. The distance between the active region 16 and the gap 22 also affects the spatial profile of the emitted radiation. The use of photolithographic techniques in defining the features of the VCSEL array allow highly accurate placing of the VCSELs and highly accurate definition of VCSEL output profiles.

Figure 4:
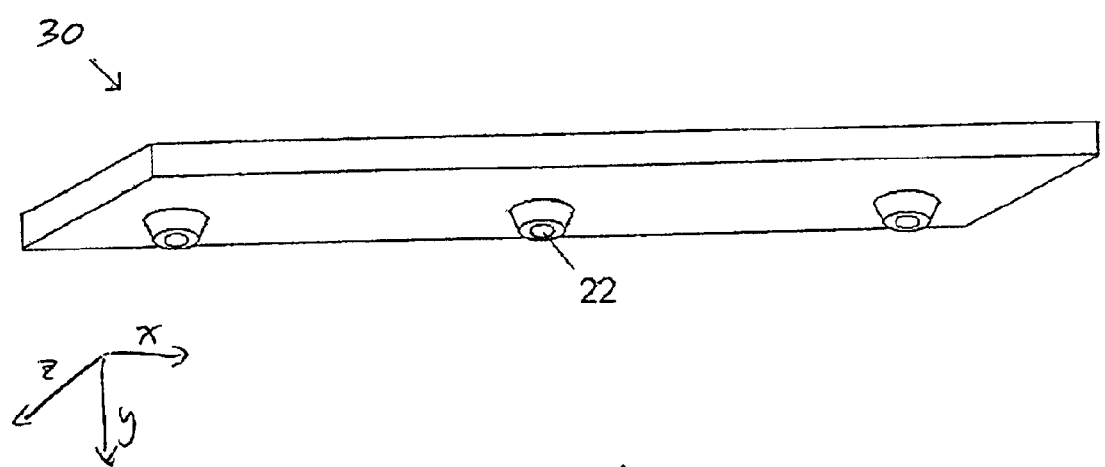
FIG. 4 is an isometric view of the one-dimensional array of VCSELs of FIG. 3 in accordance with an embodiment of the present invention.

Referring now to FIG. 4, an isometric view of a linear array 30 of VCSELs is depicted. Most of the structural aspects of the VCSELs are not visible from an outside view. The gaps 22 are visible and allow radiation to be emitted. As with FIG. 3, the dimensions have been rendered disproportional in order to make visible the various features. In various embodiments, the VCSEL separation and height are much reduced relative to the thickness of the substrate. FIG. 4 shows a linear array 30 of VCSELs manufactured such that radiation from each VCSEL is emitted along substantially parallel paths. While the array shown has three VCSELs, other embodiments include arrays having a large number of linearly arranged VCSELs.

In alternative embodiments, SELs other than VCSELs may be employed, such as a grating-coupled surface emitting laser (GCSEL). GCSELs are described in U.S. Pat. No. 5,867,521 (Macomber); and R. J. Noll & S. H. Macomber, "Analysis of Grating Surface Emitting Lasers," *IEEE J. Quantum Electronics*, vol. 26, no. 3, March 1990, pp. 456–466, the entireties of which are incorporated herein by reference.

As noted above, there is a need to couple the output(s) of one or more SELs of an array of SELs to respective laser beam "sinks," i.e. devices that receive the output of a given VCSEL. For example, it may be desired to couple the output of each VCSEL of VCSEL array 30 to a respective modulator. In alternative embodiments, the VCSELs may be operatively (optically) coupled to devices other than modulators. For example, the VCSELs may be optically coupled to SOAs or waveguides. In the present invention, the optical devices to which the VCSELs are coupled are edge-receiving optical devices, as described above. In another embodiment, the edge-receiving optical device may be any combination of modulator and SOA. The present invention also enables an array of SELs to optically couple with an array of edge-receiving optical devices. In one embodiment, the array 40 of the edge-receiving optical devices is fabricated independently from the optical bench substrate 20, in which case the array 40 of the edge-receiving optical devices is mounted inside the slot 70 on the optical bench substrate 20. As will be appreciated, various mounting techniques may be employed to mount the array 40 of the edge-receiving optical devices on the slot 70. For example, the array 40 of the edge-receiving optical devices may be mounted by solder or epoxy (not shown). In an alternative embodiment, the array 40 of the edge-receiving optical devices is monolithically fabricated on the optical bench substrate 20 in the position generally indicated by slot 70 and array 40 of FIG. 1 (in which case there is no actual slot 70).

Generally, the laser output signal will diverge in profile as it travels. In another embodiment, therefore, a lens is used to shape the output between the laser and the edge-receiving optical device. In such embodiments, the lens can be placed in an etched groove between the laser and the respective edge-receiving optical device.

Additionally, two contacts (not shown) are typically coupled to different sides of the active region of each VCSEL, such as VCSEL 22. Those of skill in the art are aware of several means by which contacts can be mounted on a surface-emitting laser. The laser can then be powered by current provided through the contacts. The laser emits a coherent electromagnetic output, i.e. a laser beam, which is to be coupled to the edge-receiving optical device. When the output laser beam of a given VCSEL is coupled to the input of a given device receiving the laser output, the VCSEL may be said to be coupled (or operationally coupled or optically coupled) to the device.

In one embodiment, the edge-receiving optical device is an electroabsorption modulator (EAM). Contacts (not shown) are generally provided to control the modulation provided by the EAM. The contacts can be provided by various methods known to persons of skill in the art. For example, the contacts can be flip-chip bonded. In another embodiment, the contacts are wirebonded from the modulator to an adjacent contact pad mounted on the substrate 20. When modulation is desired, a driver circuit can be used to provide electrical signals to one or both of the contacts, as will be appreciated by those skilled in the art. The laser output is then modulated in accordance with the electrical signals.

In another embodiment, the output of each modulator in the edge-receiving optical device array 40 is optically coupled to an SOA, which increases the power of the modulated laser output. The SOA generally includes contacts that can be mounted and placed as discussed with respect to the modulator, which provide power to the SOA.

An optical fiber (not shown) is typically provided and optically coupled to each edge-receiving optical device. The optical fiber guides the modulated and amplified laser output to its destination. Persons of ordinary skill in the art are aware of techniques for coupling the optical fiber to the edge-receiving optical device, such as butt-coupling.

As will be appreciated, the alignment of various components of embodiments of the present invention may employ SiOB techniques, as described above. In such SiOB techniques, a single crystal semiconductor material such as silicon is typically utilized as the support structure (optical bench) for various optical devices. This typically includes etching openings (e.g., the slots 60 and 70) and stops 50 on the surface of a silicon substrate in order to provide for mounting of optical components or to increase coupling efficiency between the components. Accordingly, the embodiment of the present invention shown in FIGS. 1–4 provides a method and system for accurately and efficiently aligning and coupling an array of SELs to an array of edge-receiving optical devices.

The coupled VCSELs and systems of the present invention may be employed in a variety of applications, such as data communications, telecommunications, spectroscopy, and biosensing applications. For example, one or more VCSELs of the present invention may be used as radiation sources to perform molecular spectroscopy to determine the molecular composition of various measurement species. The measurement species can be a gas or liquid, for example (disposed in a measurement cell or an unconfined gas or liquid). The measurement species can also be human compounds, such as blood, in the case of biosensing spectroscopy applications. For biosensing, the measurement species could also be a human- or biological-related compound containing bacteria and/or viruses to be detected, in which case the measurement species may be regarded as a bacterial species or viral species, respectively. Thus, the VCSELs of the present invention may also be utilized as radiation sources for pollution monitoring and other applications that involve absorption measurements.

Figure 5:
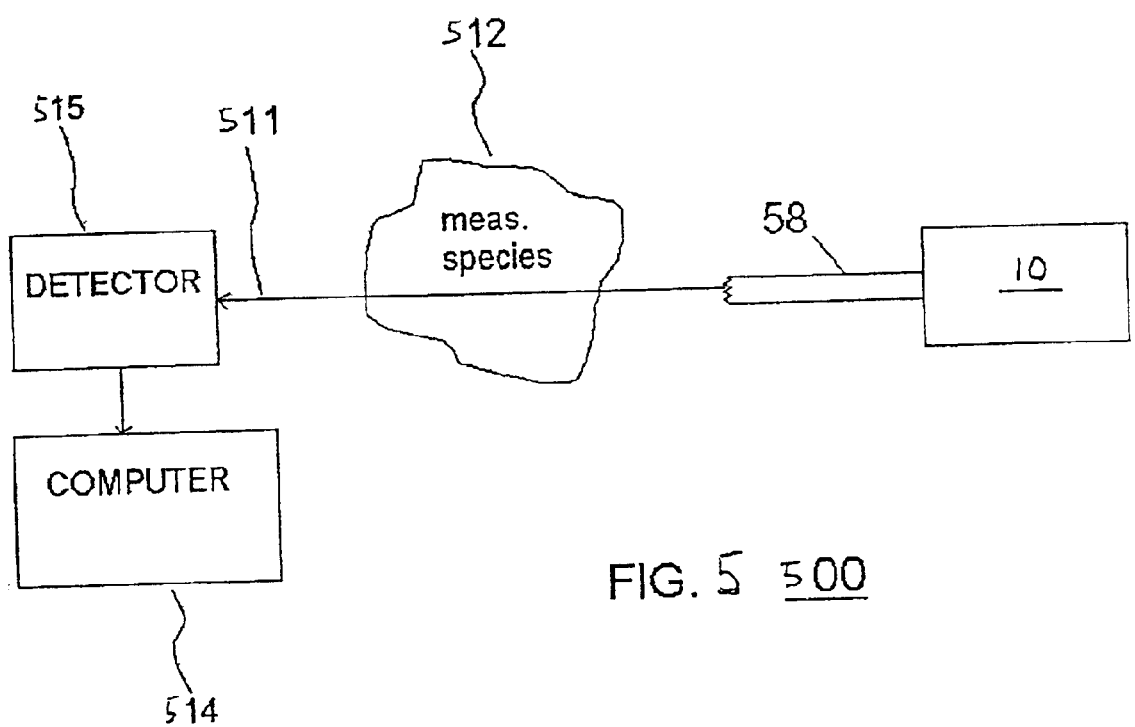
FIG. 5 is a block diagram of a spectroscopic measurement system employing one or more VCSELs of the present invention.

These embodiments are illustrated in FIG. 5, which is a block diagram of a spectroscopic measurement system 500 employing one or more VCSELs of the present invention, such as VCSEL array system 10 of FIG. 1. The electromagnetic infrared radiation (laser beam) 511 is emitted from fiber 58 of a VCSEL of the VCSEL array of system 10 of FIG. 1, so that it passes through a given measurement species 512. The measurement species may be, for example, gas in cell, unconfined gas, or blood sample. The molecules in the species selectively absorb various wavelength radiation, and the exited radiation then impinges on a conventional detector 515. A computer 514 may then analyze the result to determine the presence of certain elements in the species 512.

In an embodiment for spectroscopic absorption analysis of a gas in a cell, for example, one or more VCSELs of the present invention may be employed in a point sensing apparatus, as described, for example, in U.S. Pat. No. 5,901,168, the entirety of which is incorporated herein by reference. In such an embodiment, the (one or more) VCSEL(s) provides IR radiation and is mounted on a temperature-controlled stage for coarse wavelength tuning. IR radiation from the laser passes through a conventional gas cell (optionally a multi-pass cell), with exited radiation impinging on a conventional detector. The gas cell, in this case, contains the measurement species. The electrical output of the detector is supplied to a lock-in amplifier (together with an appropriate modulation signal, e.g., a 1.2 kHz sine wave from a modulation signal generator), and the lock-in amplifier output is supplied to a computer for data analysis and formatting. The data is then displayed and/or stored in any suitable manner. The VCSEL is pumped with an appropriate electrical current. For instance, a low frequency current ramp (e.g., 250 ms period) from a ramp current generator, short bias pulses (e.g., 5 ns pulse width, 2 $\mu$s period) from a bias current generator, and a modulation signal from a modulation current generator are supplied to a combiner, and the resultant current ramp with superimposed current pulses and sine wave is applied to the laser. The current ramp serves to sweep the laser temperature over a predetermined range, and the pulses cause the emission of short laser pulses. The pulse wavelength is slowly swept over a range of wavelengths, and absorption as a function of wavelength is determined. Thus, the presence in the cell of a gas that has an absorption line in the range of wavelengths is readily detected, and the gas can be identified. In such an embodiment, the output of the VCSEL is coupled in accordance with the invention to the gas in the cell, e.g. by coupling the VCSEL to a fiber which is then used to pass the IR radiation through the gas in the cell. In alternative embodiments, VCSEL(s) of the present invention produce radiation at other than IR wavelengths, for spectroscopic or other applications.

VCSELs of the present invention may also be employed in an embodiment in which the measurement species is an unconfined gas (e.g. for pollution monitoring). For example, one or more VCSELs of the present invention may be utilized in a remote-sensing system, wherein an emission source such as a factory emits a gaseous emission cloud (the unconfined gas or measurement species). One or more VCSELs of the present invention is positioned to emit IR radiation which propagates through the emission cloud, and is reflected (e.g., by means of a corner reflector). The reflected radiation is then detected by means of a detector. The VCSEL can be pumped in any appropriate manner, e.g., as described above, and the detector output can be utilized in any appropriate manner, e.g., also as described above. A mirror or other appropriate reflector can be used instead of a comer reflector. The reflector can be on an aircraft or any elevated feature, including the smoke stack that is being monitored. The detector could also be on an aircraft, or be on an elevated feature. In general, any arrangement that results in a line-of-sight disposition of laser and detector is contemplated. In such an embodiment, the output of the VCSEL(s) is coupled in accordance with the invention to the unconfined gas. For example, multiple VCSELs of an array may each be coupled to a respective fiber, which are then combined into a single fiber, which directs the combined IR radiation from all the VCSELs through the unconfined gas.

In such applications and embodiments, the VCSEL of the present invention will generally be mounted in an appropriate housing for protection and control. The package will typically comprise cooling means (e.g., water cooling, thermoelectric cooling), temperature sensor means (e.g., a thermocouple) for use in a feedback loop for temperature control, and means for applying the pump current to the laser. The VCSEL is attached in conventional fashion to the cooling means. Optionally the housing may also contain detector means for controlling laser output power. The housing will typically have a window that is transparent for the laser radiation, and will typically be evacuated or filled with inert gas.

In the case of biosensing applications, for example, the output radiation at wavelengths appropriate for absorption by the element or compound to be detected, is coupled in accordance with the present invention to a fiber, which directs the radiation into the measurement species (e.g., the human blood beneath the skin of a finger).

As will be appreciated, multiple VCSELs may be employed in such applications. For example a 2×2 array of 4 VCSELs, each having a different wavelength, may be used to detect multiple gases, or to better detect one gas. In such an application, for example, each of the VCSELs may be coupled to a fiber, using the coupling technique and system of the present invention. These fibers may be used to direct the radiation of all four VCSELs through the gas species to be measured. Other variations may be employed, such as coupling the output of multiple VCSELs to a single fiber to emit the combined (superimposed) radiation through the gas species.

Therefore, in such applications, one or more VCSELs are coupled in accordance with the present invention to a measurement species such as a gas disposed in a measurement cell or an unconfined gas. The VCSELs may be coupled to the gas via fibers to which they are respectively coupled, in accordance with the present invention, for example. In this application, the coupled VCSELs of the present invention are part of a system for measuring infrared radiation absorption by a measurement species, where the system has one or more sources of single mode infrared laser radiation (comprising the coupled VCSEL(s)), and a detector for detecting the single mode infrared laser radiation after passage thereof through a quantity of said measurement species.

Coupled VCSELs of the present invention may also be utilized for communications applications, such as datacom and telecom. For example, an array of VCSELs may be fabricated, each of which has a narrow and closely-spaced wavelength in an appropriate range (e.g., around 850 or 1310 nm for datacom, or 1550 or 1310 nm for telecom), and each coupled in accordance with the invention to an external modulator. The modulated signals may be combined in a single fiber, and transmitted to subsequent destinations (e.g. shorter distances for datacom applications, larger distances for telecom applications). Alternatively, all of the VCSEL outputs may be combined together and modulated together for distribution on different wavelengths to various laser beam sinks.

In accordance with an embodiment of the present invention, the system 10 conditions the output signals of an array of SELs using an array of edge-receiving devices. To condition the output signals in accordance with the present invention, the laser array 30 is mounted into the slot 60 of the optical bench substrate 20 and the array 40 of the edge-receiving optical devices is mounted into slot 70 of the substrate 20. In one embodiment, the optical bench substrate defines alignment features 50, 60, 70. The laser array 30 is mounted on its edge and aligned by the slot 60 and the alignment features 50 such that the output signals emit directly into the edge-receiving optical devices array 40. The output signals of the SELs are therefore conditioned as they are received by the edge-receiving optical devices array 40.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. An apparatus for optically coupling at least one surface-emitting laser to at least one edge-receiving optical device comprising:

(a) an optical bench substrate having a mounting surface in the x-y coordinate plane, the mounting surface having a plurality of alignment features comprising a pair of x-direction stops and a pair of y direction stops defined therein;

(b) an array comprising the at least one edge-receiving optical device, said array monolithically fabricated and mounted on the mounting surface of the optical bench substrate, wherein:

each of the at least one edge-receiving optical device has an input edge in the x-z coordinate plane, each said input edge being perpendicular to both the mounting surface and to the substrate of the at least one edge-receiving optical device, whereby each of the at least one edge-receiving optical device is adapted to receive light traveling in the y direction into its input edge; and each of the at least one edge-receiving optical device is for conditioning light traveling in the y-direction and received at its input edge; and (c) the at least one surface-emitting laser, said at least one surface-emitting laser having a primary epi surface from which laser radiation is emitted in a direction perpendicular to the primary epi surface, a mounting edge perpendicular to the primary epi surface, and an active region parallel to the primary epi surface and perpendicular to the direction in which the laser radiation is emitted, the at least one surface-emitting laser being mounted at its mounting edge on the mounting surface in the plurality of alignment features, with the pair of x direction stops bounding the mounting edge and for securing the at least one surface-emitting laser from movement in the x direction and the pair of y direction stops bounding the mounting edge and for securing the at least one surface-emitting laser from movement in the y direction, further wherein the plurality of alignment features are positioned on said mounting surface with respect to the at least one edge-receiving optical device, so that the primary epi surface of the at least one surface-emitting laser is in the x-z coordinate plane and the at least one surface-emitting laser, when activated, will emit laser radiation in the y direction and into the input edge of the at least one edge-receiving optical device, respectively, whereby the at least one surface-emitting laser is directly optically coupled to the at least one edge-receiving optical device, respectively.

2. The apparatus of claim 1, wherein the at least one surface-emitting laser comprises an array of surface-emitting lasers and the at least one edge-receiving optical device comprises a corresponding array of edge-receiving optical devices having one edge-receiving optical device for each respective surface-emitting laser.

3. The apparatus of claim 1, wherein the edge-receiving optical devices of the at least one edge-receiving optical device are edge-receiving optical modulators.

4. The apparatus of claim 3, wherein each of the at least one edge-receiving optical device further comprises an edge-receiving optical amplifier positioned in the path of the output signal from said each edge-receiving optical modulator.

5. The apparatus of claim 1, wherein the edge-receiving optical devices of the at least one edge-receiving optical device are edge-receiving optical amplifiers.

6. The apparatus of claim 1, wherein the edge-receiving optical devices of the at least one edge-receiving optical device are semiconductor optical amplifiers (SOAs).

7. The apparatus of claim 1, wherein each of the at least one surface-emitting laser is a VCSEL.

8. The apparatus of claim 1, wherein the optical bench substrate is a silicon optical bench.

* * * * *